United States Patent

Wang et al.

[11] Patent Number: 5,867,693
[45] Date of Patent: Feb. 2, 1999

[54] EXTENDED RESOLUTION PHASE MEASUREMENT

[75] Inventors: Niantsu Wang, Milpitas; Maw-kuei Tsai, Cupertino, both of Calif.

[73] Assignee: Modern Video Technology, Inc., San Jose, Calif.

[21] Appl. No.: 887,779

[22] Filed: Jul. 3, 1997

[51] Int. Cl.$^6$ ........................................................ G06F 1/04
[52] U.S. Cl. ....................... 395/555; 395/558; 364/724.06
[58] Field of Search ................................. 395/555, 556, 395/557, 558; 364/484, 485, 486, 487, 724.06, 724.08; 702/72, 75, 78

[56] References Cited

U.S. PATENT DOCUMENTS 4,954,961   9/1990   Fontanes et al. ........................ 364/484
5,343,414   8/1994   Asghar et al. ...................... 364/724.06

OTHER PUBLICATIONS

ZMI System Documentation: Operation Manual OMP–0329; Zygo Corporation, Middlefield, Connecticut; Jul. 1992; cover shhets (2) and pp. 4–1 to 4–5.

*Primary Examiner*—Dennis M. Butler
*Attorney, Agent, or Firm*—Raymond E. Roberts; Michael J. Hughes

[57] ABSTRACT

A circuit (10) for determining periods of and the phase relationship between waveform signals (28 and 30). A delay line (12) having a sample port (14), a set port (16), a reference port (18), and an output port (20) and further internally including a chain of delay elements (32) associated with latch elements (34) and an encoder (36). The delay line (12) receive a first signal (28) into the sample port (14), and via a switch (22) also into the set port (16). The encoder (36) then provides the period of the first signal (28) at the output port (20) of the delay line (12) in units of delay created by each delay element (32). A control unit (24) then operates the switch (22) to direct a second signal (30) into the set port (16) for comparison with the first signal (28) at the sample port (14), and values are obtained at the output port (20) relating edges of a cycle in the second signal (30) to edges of the first signal (28), from which period of the second signal (30) and the phase relationship between the signals (28 and 30) is calculated with an arithmetic unit (26).

21 Claims, 8 Drawing Sheets

EXTENDED RESOLUTION PHASE MEASUREMENT

TECHNICAL FIELD

The present invention relates generally to accurate determination of wave phase. In application, this accuracy may then be used either for extending the resolution of measurements made using wave energy, or for precisely controlling the phase of wave energy. Examples of such applications are presented herein in the contexts of color video signal demodulation and laser interferometric displacement measurement, but the present invention also has broad applicability to virtually all fields where determination or control of wave phase is important.

BACKGROUND ART

Our society has increasingly come to rely upon various devices and processes using wave energy. Some common household examples are electrical systems such as radio, television, and computer circuitry. And some common industrial examples are optical measuring tools, such as laser instruments, although in these the light waves usually are converted to electrical signals at some point.

The most basic attributes of a wave are its amplitude and its frequency. But the timing characteristics of waves, or the "phase," can also be important. The Random House Dictionary of the English Language (1966) gives as its ninth definition of phase: "a particular stage or point of advancement in a cycle; the fractional part of the period through which time has advanced, measured from some arbitrary origin." Waves are cyclical in nature, and once a point in a particular cycle of a particular wave is defined as an origin, it follows that any other point in the same wave, or any point in another coexisting wave can be described with a phase value. Put more simply, we can describe the timing relationship between two distinct waves or between two parts of the same wave as a phase value. Such values can have many uses, such as telling what proportion of a wave cycle has elapsed, or what time has expired since the beginning of a cycle, or what the degree of synchronization, or lack thereof, is between parts of the same wave or of different waves.

The present invention relates to improving the accuracy of measurement of and optionally our control over the attribute of wave phase. Because wave phase is so fundamental to the operation of devices and processes used in homes and in industry, two quite distinct examples of the use of wave phase and the present invention are presented. The first of these is drawn from the field of television, where during signal demodulation one part of a complex signal waveform must be precisely synchronized by another waveform to accurately extract and use color video information. The second example is drawn from the field of laser interferometry, where the change in phase of a measurement signal relative to a reference signal can be used to determine a physical displacement. Of course, many other examples of the use of wave phase are possible, and the examples used herein should not be interpreted as limiting the spirit of the present invention, or the scope of the claims to it which follow.

TELEVISION EXAMPLE

In video systems such as those used in color television the display image is generated line by line. The telecine is scanned by a camera horizontally line by line through a set of filter lenses to generate primary red, green, and blue ("RBG") color signals. These signals are then combined and transformed further into a set of three signals. One of these is the luminance (hereinafter "luma") signal, which represents the brightness of the picture. The other two are color difference signals which carry hue and saturation color information.

For broadcast systems using the standards put forth by the National Television System Committee (NTSC; adopted primarily in the United States, other parts of the Americas, and Japan), these difference signals are termed I and Q (for "in phase" and "quadrature" respectively). Alternately, for broadcast systems using the phase alternate line system (PAL; adopted in much of Europe, and China), these are called U and V. The I/Q or U/V signals are used to modulate a balanced modulator at a frequency near the cutoff of the video signal bandwidth: the so-called color subcarrier frequency ($f_{SC}$; respectively around 3.58 MHz for NTSC and 4.43 MHz for PAL). Further, since the subcarrier is suppressed, amplitude modulated sidebands in quadrature (differing in phase by 90 degrees) are produced, and these are added together to form a chrominance (hereinafter "chroma") signal, one in which the phase represents the hue and the amplitude represents the saturation of the color information to be broadcast. An active data signal is then formed by combining the chroma signal with the luma signal, and synchronization information is further added to form composite video in the baseband signal which is suitable for radio frequency transmission, or for storage on video tape for later retrieval and playback.

At the ultimate receiver, the synchronization components of the baseband signal are particularly important. They are used to facilitate the separation of the chroma signal from the luma signal, and eventually for the receiver to demodulate the chroma signal back into the I/Q or U/V signals. For the line and field, square wave synchronization pulses are used at the respective needed frequencies (these are commonly termed the horizontal sync and vertical sync). In contrast, since the subcarrier has been suppressed, a burst of the subcarrier signal for several cycles is included in each line before the active data content in the signal. This is called the color burst, and it consists of a fixed number of sinusoidal cycles (about 9 for NTSC and 10 for PAL) having precise phase, so that they can be used as a reference by the receiver to correctly decode the varying phase of the color information on the line that follows.

In a digital system such as a digital TV, a monitor, or a VCR, a digital receiver is used to digitize the composite video signal, to separate the chroma signal from the luma signal via filtering, and to demodulate the chroma signal back into the I/Q or U/V signal components. To perform this demodulation a pair of sinusoidal waveforms which are in synchronization with the color burst must be regenerated by the receiver. The sample clock which is used to digitize the active data must therefore have a fixed phase relationship with the color burst, so that the correct phase and hence the correct values for these sinusoidal functions can be calculated at each sample instant. Further, this synchronization must be accomplished at the beginning of each line, shortly after the color burst period.

The present state of the art method is to use a digital phase locked loop (DPLL) which adjusts its phase and frequency during the color burst period. The DPLL consists of a DCO (digitally controlled oscillator), a digital loop filter and a phase comparator. The digitized color burst signal is compared with the output of the DCO to detect a phase error, which is then filtered and used to change the frequency and hence the phase of the DCO, much as in a conventional analog PLL. However, since any phase error introduced during the color burst period accumulates as the sample clock proceeds along the line of active data content, the frequency locking must be accurate to an order of several tens ppm (parts per million). With today's DPLL technology such accuracy can only be achieved by using a highly accurate and temperature stable voltage controlled crystal oscillator (VCXO) to drive the DCO. Further, the locking range of the DPLL is severely limited by the extremely high Q of the crystal, and the crystal frequency must be very close to $f_{SC}$, or else an integral multiple of it (such as $4f_{SC}$). For large line to line frequency fluctuations, such as those found in typical VCR's, this makes accurate locking extremely difficult. Still further, since the color bust has amplitude much lower than the full signal range (which is normally represented digitally in 8 bits), the digitized color burst signal which the DCO locks to has at best only 6 bits accuracy, and this leaves yet more opportunity for phase error. In short, DPLL's as described above work best only for very stable inputs such as those from TV stations which maintain very accurate frequencies for broadcasting purposes.

Another problem with the state of the art method is that in practice the frequency of a receiver's sample clock may not be an integral multiple of $f_{SC}$. Since a DPLL can only lock onto some multiple of $f_{SC}$, with sufficiently small initial frequency discrepancy, the data must first be sampled at the DCO's frequency and then resampled by the sample clock which is determined by the application. These multi-rate operations on digital data require digital filtering, which is expensive in hardware implementation, and which, worse yet, usually introduces artifacts that degrade image quality.

From the preceding, it follows that the color and quality of images reproduced from television broadcasts, and particularly from video tape media, have been limited by the prior art's limitations when resolving the phase relationship between parts of complex electrical waves.

INTEROFEROMETRY EXAMPLE

In 1887 Albert Michelson invented the interferometer, and then went on to use interferometry to detect the fine structure in atoms. Michelson's experiment permitted light from an arc lamp to emerge from a slit and pass through a 50% beam splitter. The light then divided into two components, a reference beam which was directed to a fixed mirror, and a measurement beam which was directed to a movable measuring mirror. Both components were then directed back through the beam splitter, where they recombined and interference between the beams occurred.

A number of different types of interferometry are possible, but the example used here is displacement interferometry. In an apparatus such as Michelson's, when the measuring mirror is moved (i.e., displaced) the reflected light is brought periodically into and out of phase with the light reflected from the fixed mirror. Movements of ¼ or ¾ of a light wavelength produce an out-of-phase or destructive interference between the light beams, which results in the cancellation of light, and causes a dark line (i.e., a fringe) to appear on a viewing surface. Similarly, ½ wavelength movement increments produce in-phase or constructive interference, which cause a bright line or fringe on the viewing surface. The number of such bright and dark fringes may then be counted and used to calculate the length of movement (i.e., the displacement of the measuring mirror, in ½ wavelength increments).

Displacement laser interferometry today still uses generally the same principles which Michelson did over a hundred years ago, but with considerable apparatus improvement due to more modern technology. For example, the arc lamp is usually replaced with a laser, and an electronic photodetector is usually used in place of the human eye for fringe counting.

One improvement upon Michelson's basic technique is to multiply the times which the measurement beam travels to and from the measuring mirror, by forcing it to make a number of passes. Thus while a single measurement beam path produces resolution of ½ wavelength (termed an optical enhancement factor of 2 because the light travels twice the direct distance to the measuring mirror, once there and once back), a doubled path (twice both there and back) produces ¼ wavelength resolution, etc. However, to more than quadruple the measurement beam path is cumbersome, and optical enhancement factors other than 2, 4, or 8 are not generally considered practical.

Another modern improvement is dual frequency laser interferometry. For this a light beam is provided having two orthogonal linear polarizations of different frequency ($f_1$ and $f_2$). This beam is split with a polarizing beamsplitter into a reference beam having only frequency $f_1$ and a measurement beam initially having frequency $f_2$. Both of these beams travel as in conventional interferometry. However, as the measuring mirror is moved, the measurement beam undergoes a Doppler shift effect (roughly, a velocity of 12 inches per second produces a frequency shift of 2 MHz) such that the its frequency becomes $f_2 \pm \Delta f_2$. At the interferometer detector the frequencies present are the discrete light frequencies ($f_1$, $f_2 \pm \Delta f_2$), their difference ($f_1 - f_2 \pm \Delta f_2$), and their sum ($f_1 + f_2 \pm \Delta f_2$). However, due to the limits of conventional electronics, the detector only detects the difference component ($f_1 - f_2 \pm \Delta f_2$), and it becomes the measurement signal ($f_M = f_1 - f_2 \pm \Delta f_2$). A reference signal ($f_R$) is also taken (usually by tapping off the modulating means in the laser head) which has as its frequency the difference between the dual frequencies of the initial light beam ($f_R = f_1 - f_2$; 2 MHz is typical). Thus the measurement signal may also be stated as $f_M = f_R \pm \Delta f_2$.

The goal of displacement interferometry is to determine distance. Here the velocity equals $\lambda/F^*(f_M - f_R)$ in which $\lambda$ is the wavelength of the laser source ($\lambda = 633$ nm is typical for HeNe lasers; 1 nm = $1 \times 10^{-9}$ meter), and F is the optical enhancement factor. A term q may also be introduced to represent resolution extension, providing velocity=$\lambda/(F^*q) *(q^*f_M - q^*f_R)$. This is quite useful because:

$$\text{Distance} = \int (\text{velocity}) dt \qquad \text{Eq. 1.1}$$

$$\text{Distance} = \lambda/(F^*q) * \int (q^*fM - q^*fR) dt \qquad \text{Eq. 1.2}$$

Eq. 1.1 and 1.2 are "basic equations," which are useful in numerous possible approaches to resolution extension for dual frequency laser interferometry. The major such prior art approaches are now discussed.

The Fundamental Approach (No Resolution Extension):

Without any resolution extension q=1, and Eq. 1.2 becomes simply:

$$\text{Distance} = \lambda/F^* \qquad \text{Eq. 2.1}$$

$$(\int_{t_0}^{t_1}(fM)dt + \int_{t_1}^{t_2}(fM)dt + \ldots + \int_{t_{i-1}}^{t_i}(fM)dt - \int_{t_0}^{t_1}(fR)dt - \int_{t_1}^{t_2}(fR)dt - \ldots - \int_{t_{i-1}}^{t_i}(fR)dt)$$

The reference and measurement signals produced are processed as square waves having a common reference point defined for each cycle, say at a rising edge. It follows that by directly counting such edges in the reference and measurement signals, the Fundamental Approach can be performed with resolution of $\lambda/2$, $\lambda/4$, or $\lambda/8$, depending upon what kind of optics are used in the interferometer (i.e., depending upon F). Further, if one takes $t_i$ as timed to coincide with the rising edges of $f_M$ and $t_j$ as timed to coincide with the rising edges of $f_R$, Eq. 2.1 simplifies to:

$$\text{Distance} = \lambda/F^*(\text{sum of edges of } f_M - \text{sum of edges of } f_R) \qquad \text{Eq. 2.2}$$

Using the Fundamental Approach, the obtainable measurement resolution is controlled by the light wavelength and the multiplying effect of the number of optical paths used. In this approach only a count of the number of fringes is used, and the actual phase relationship between the reference frequency and the measurement frequency is not used. However, this approach provides a starting point for the more sophisticated approaches below.

The Fast Pulse Approach:

In this approach, the reference and measurement signals are phase locked to higher frequencies $q^*f_R$ and $q^*f_M$ respectively, and the edges in these signals are counted. The equations used for this approach are the same as those used for the Fundamental Approach, except that $q^*f_R$ and $q^*f_M$ are substituted for $f_R$ and $f_M$ to get:

$$\begin{aligned}\text{Distance} &= \lambda/(F^*q)^*(\int(q^*f_M - q^*f_R)dt) \qquad \text{Eq. 3.1}\\ &= \lambda/(F^*q)^*\left(\int_{t0}^{t1}(q^*f_M - q^*f_R)dt + \right.\\ &\qquad \int_{t2}^{t1}(q^*f_M - q^*f_R)dt + \ldots +\\ &\qquad \left.\int_{ti-1}^{ti}(q^*f_M - q^*f_R)dt\right)\end{aligned}$$

This approach can typically provide resolution in the range of $\lambda/4$ to $\lambda/480$. However, as higher resolutions are attempted, speed limitations become severe. For example, the typical clock frequency used for sampling must be at least twice the highest of either $q^*f_R$ or $q^*f_M$ respectively (due to the Nyquist limit on sampling frequency).

The Reference Phase Locked Approach:

This approach phase locks only the reference signal to $q^*f_R$, and uses that signal as a clock frequency, $f_C$, to sample the measurement signal. Improvement upon the speed drawback of the Fast Pulse approach is obtained here by not having to phase lock to the much wider frequency bandwidth of the measurement signal. Eq. 3.1 again applies, but further if each $t_i$ is timed to coincide with the rising edges of $f_M$ and since:

$$1 = \int_{t_{j-1}}^{t_j}(f_M)dt \qquad \text{Eq. 4.1}$$

Eq. 3.1 can here be simplified to:

$$\begin{aligned}\text{Distance} &= \lambda/(F^*q)^*\left(\left[q - \int_{t0}^{t1}(f_C)dt\right] + \right.\\ &\qquad \left.\left[q - \int_{t1}^{t2}(f_C)dt\right] + \ldots + \left[q - \int_{ti-1}^{ti}(f_C)dt\right]\right) \qquad \text{Eq. 4.2}\\ &= \lambda/(F^*q)^*([q - (\text{counts of } f_C \text{ between edges}\\ &\qquad t_0 \text{ and } t_1 \text{ of } f_M)] + [q - (\text{counts of } f_C \text{ between}\\ &\qquad \text{edges } t_1 \text{ and } t_2 \text{ of } f_M)] + \ldots + [q - (\text{counts}\\ &\qquad \text{of } f_C \text{ between edges } t_{i-1} \text{ and } t_i \text{ of } f_M)])\end{aligned}$$

The A/D Approach:

This approach replaces the fast frequency generated by the Fast Pulse Approach with a saw-tooth waveform in which voltage differences represent phase differences. An analog to digital (A/D) converter is then used to convert the voltage at pre-determined points along the saw-tooth waveform to obtain the desired interferometer resolution. This approach is similar to using a super fast phase lock loop to update the counter, at a particular point the converter output can be the same as the updated counter. To some extent, this approach can provide improved measurement resolution.

Interpolation Approach:

This emulates the Fast Pulse approach by using a group of signals having incrementally separated long period pulses as if they were one short period signal. The incremental separation of the long pulses is accomplished by use of a delay line. Zygo Corporation of Middlefield, Conn., uses this technique in its ZMI system.

SUMMARY OF THE PRIOR ART

Unfortunately, as increased resolution is sought, the prior art approaches cease to be practical. For example, the Fast Pulse Approach generates lock frequencies which are beyond practical counting means, and the A/D Approach generates analog signals which are beyond the handling capabilities of practical electronics.

From the preceding, it follows that the resolution of measurement obtainable in the art of laser displacement interferometry is quite limited by the inability to accurately determine the phase relationship between two light waves.

DISCLOSURE OF INVENTION

Accordingly, it is an object of the present invention to provide a system for accurate determination of waveform period.

Another object of the invention is to provide a system for accurate determination of the phase relationship of two waveforms.

Another object of the invention is to provide a system for accurate generation of waveforms in predetermined phase relationship with an externally supplied waveform.

And, another object of the invention is to provide a system for accurate determination of phase relationships of two externally supplied waveforms relative to a generated clock waveform.

Briefly, a first preferred embodiment of the present invention is a device for determination of waveform period including a delay line having a sample port, a set port, a reference port, and an output port. The delay line includes a chain of delay elements, the first connected to the sample port, and each connected to a respective latch element. The latch elements connect to an encoder, which is connected to the output port, and the set port and the reference port each separately connect in common all the latch elements. The device further includes a control unit connected to the output port and to an arithmetic unit, a connection for a first waveform to the sample port and to the control unit, a connection for a second waveform to the set port and to the control unit, and a connection for the reference port to an externally supplied DC voltage. The control unit counts cycles of the first waveform occurring during a target cycle of the second waveform, which it and passes to the arithmetic unit. The control unit also directs the arithmetic unit to obtain an initial value from the output port at the start of the target cycle and a terminal value at the end of said target cycle, both from the output port. The arithmetic unit then calculates the period of the second waveform from a period of the first waveform, the cycles count, and the initial and terminal values. This embodiment may use either a pre-entered "know" period value for the first waveform, or it may switch the first waveform into the set port temporarily and obtain a measured value at the output port.

Briefly, a second preferred embodiment of the present invention is a device for determination of phase relationship which is structurally the same as the above first preferred embodiment, except that the arithmetic unit uses necessarily more complex formulas to calculate the phase of the second waveform relative to the first waveform from the period of the first waveform, the cycles count, and the initial and terminal values.

An advantage of the present invention is that it provides accurate devices for determining period of and phase relationship between waveforms. Further, only the addition of a switch and arithmetic calculating capability is needed to construct embodiments which can perform both of these tasks. This is particularly advantageous, since the formulas used to calculate phase relationship require either knowledge or measurement of the periods of the waveforms being compared.

Another advantage of the invention is that it can determine periods of and phase relationships between waveforms having quite different and unrelated frequencies.

And, another advantage of the invention is that it may be implemented in manners such that it is easily initially calibrated, and further can continuously self-calibrate during use. These capabilities are particularly useful to prevent loss of accuracy due to conventional electronic circuitry concerns such as thermal effects and voltage supply fluctuation over time.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended drawings in which.

BEST MODE FOR CARRYING OUT THE INVENTION

The phase resolution extension technique of the present invention employs an active delay line concept which may be implemented as electronic circuits of varying complexity for specific applications. As illustrated in the various drawings herein, and particularly in the view of FIG. 1, one preferred embodiment of the inventive device is depicted by the general reference character 10.

Figure 1:
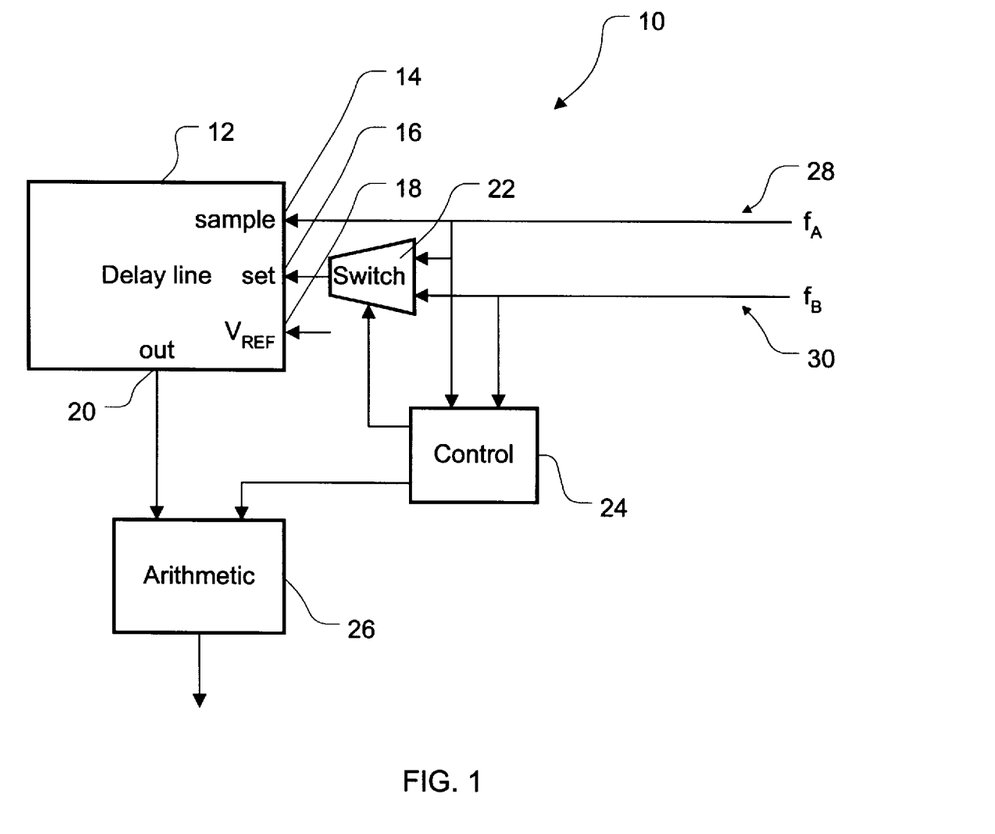
FIG. 1 is a block diagram depicting a basic embodiment of the present invention.

FIG. 1 depicts a basic embodiment of the inventive circuit 10 wherein a generally conventional delay line 12 is provided which has a sample port 14, a set port 16, a reference port 18, and an output port 20. Further included are a switch 22, a control unit 24, and an arithmetic unit 26. Inputs to the circuit 10 are a first signal 28 ($f_A$) and a second signal 30 ($f_B$).

Figure 2:
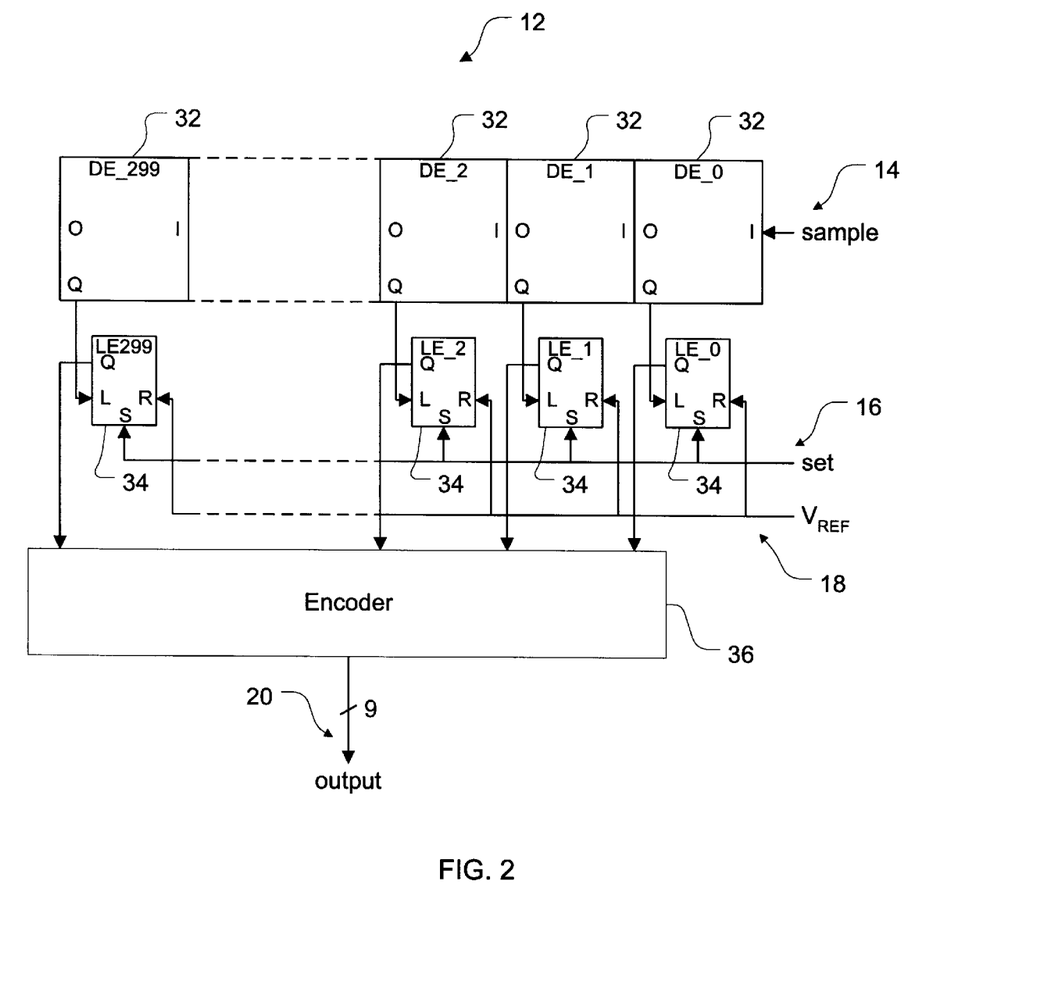
FIG. 2 depicts some internal details of the delay line in FIG. 1.

FIG. 2 depicts internal details of the delay line 12 of FIG. 1. Included are a chained set of active delay elements 32 (DE) having outputs which each go to respective dynamic latch elements 34 (LE). The set port 16 and the reference port 18 of the delay line 12 are common for each latch element 34. When the set port 16 is precharged low and then receives a rising signal, each latch element 34 is set according to the relative magnitudes of the input voltages received from its respective delay element 32 and the common supplied voltage at the reference port 18. Thus, when a signal at the set port 16 "sets" the delay line 12 it follows that at least one 0 to 1 transition should exist somewhere along the bank of latch elements 34.

The outputs of the latch elements 34 feed into an encoder 36 which creates a binary value at the output port 20 of the delay line 12. In the examples and figures used herein there are 300 delay elements 32 and latch elements 34 depicted. Selection of the number of of delay elements 32 and latch elements 34 used will usually be motivated by the longest period of the signals or signal parts which are being compared. Each delay element 32 contributes an increment of delay ($t_D$) on the order of 100–200 picoseconds, which when multiplied by a suitable total number of delay elements 32 insures that the amount of delay provided will be longer than a single period of interest. The number of delay elements 32 and latch elements 34 used similarly motivates the number of bits output by the encoder 36, which becomes the binary value provided by the output port 20 of the delay line 12 (9 bits in the examples and figures used herein, to count at least as high as 300 in binary).

The circuit 10 in FIG. 1 can be used to accurately determine the period ($T_A$) of the first signal 28 ($f_A$). To do this the control unit 24 first sets the switch 22 so that a signal obtained by dividing the first signal 28 ($f_A$) by two is fed into both the sample port 14 and the set port 16 of the delay line 12. This produces a string of 1's, a 1 to 0 transition, a string of 0's, and then a 0 to 1 transition along the series of latch elements 34 (recall that by design the total delay of the delay line 12 is longer than a single period of the signals being compared). The delay line 12 then provides at its output port 20 a value (X) which is a count of the 0's, between the 1 to 0 and the 0 to 1 transitions.

The period ($T_A$) of the first signal 28 ($f_A$) is now known, since $T_A$=X. The period ($T_A$) is in "units" of $t_D$. If conventional units in seconds are desired the formula $T_A=X*t_D$ may be used to obtain this. Any such multiplication, and storage for later use, are performed in the arithmetic unit 26.

Figure 3:
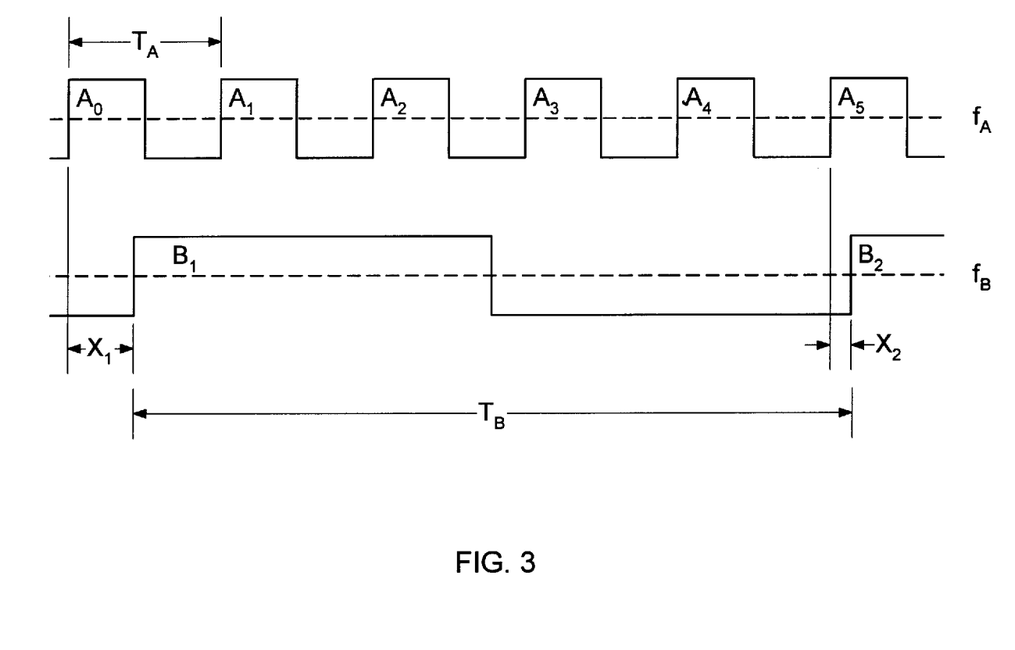
FIG. 3 is a timing diagram for input signals to FIG. 1.

The circuit 10 of FIG. 1 may also be used to determine the period ($T_B$) of the second signal 30 ($f_B$) and the timing (i.e., phasing) between the first signal 28 ($f_A$) and the second signal 30 ($f_B$). FIG. 3 is a timing diagram for the circuit 10 depicting this. The first signal 28 ($f_A$) is again directly fed into the sample port 14, but the control unit 24 now sets the switch 22 to feed the second signal 30 ($f_B$) into the set port 16.

Arrival of any rising edge in the second signal 30 ($f_B$) causes the delay line 12 to effectively freeze its output for the high part of that cycle. The control unit 24 monitors both the first signal 28 ($f_A$) and the second signal 30 ($f_B$), and when it detects a rising edge ($B_1$) in the second signal 30 ($f_B$) it directs the arithmetic unit 26 to store the value at the output port 20 of the delay line 12 as $X_1$, a binary value in units of $t_D$ reflecting the delay between the two rising edges $A_0$ and $B_1$. Further, having noted the rising edge ($B_1$), the control unit 24 also resets an internal counter and proceeds to take a count (Y) of the subsequent number of rising edges ($A_1$–$A_5$ in this example) of the first signal 28 ($f_A$), until a subsequent rising edge ($B_2$) is noted in the second signal 30 ($f_B$). Once the subsequent rising edge ($B_2$) does arrive, the output of the delay line 12 is again effectively frozen for a half cycle of the second signal 30 ($f_B$), and the control unit 24 directs the arithmetic unit 26 to store the value at the output port 20 of the delay line 12 as $X_2$, a binary value reflecting the delay between the last rising edges, $A_5$ and $B_2$. Finally, the control unit 24 also passes the count (Y) which it has been keeping to the arithmetic unit 26.

With the arithmetic unit 26 it is possible to calculate the period ($T_B$) of the second signal 30 ($f_B$) with:

$$T_B = Y*T_A - X_1 + X_2 \qquad \text{Eq. 5.1}$$

where Y, $X_1$, and $X_2$ have just been counted in increments of $t_D$, and $T_A$ is known because it has been previously measured. Again conversion to conventional units of seconds is easily accomplished. Further, the phase of the second signal 30 ($f_B$) in relation to the first signal 28 ($f_A$) is easily calculated with the formula $\theta = X_1/T_A$ (multiplying by $2\pi$ or 360 to convert to units of radian or degree measure if desired).

A particular point to note about the circuit 10, as used in this scenario, is that the first signal 28 ($f_A$) and the second signal 30 ($f_B$) do not need be equal or even relatively close in frequency (i.e., they may have entirely different periods, $T_A$ and $T_B$).

The circuit 10 does include some sources of potential error, such as variations in $V_{REF}$, $t_D$, and $T_A$, but these can all be closely controlled to insure that any actual error is minimized. Variations between individual $t_D$ average out across the number used (300 in the examples used here). The accuracy of $X_1$ and $X_2$ are affected by variations in $V_{REF}$ or $t_D$, to address this $V_{REF}$ can be taken from a stable direct current (DC) source (say $V_{REF}=V_{DD}/2$; $V_{DD}$ for DC supplied to CMOS drains in the preferred embodiment). In fact, as is described below in a detailed example, it is possible to construct an embodiment of the present invention which dynamically self-compensates for changes in $V_{REF}$, to obtain still greater stability and accuracy. This leaves $T_A$, which, as described for circuit 10 above, can be measured. Or instead, a very stable source may be used to supply a "known" value for $T_A$, e.g., if a temperature stabilized crystal oscillator is used as a constant for $T_A$ might simply be entered for use in calculations.

The preceding is the basic inventive circuit 10. Discussion now turns to specific embodiments to solve the two problems introduced in the Background Art section. However, it is again stressed that the necessarily limited examples presented herein should not be used to restrictively interpret the true scope of the present invention.

APPLICATION OF THE INVENTION IN TELEVISION

Figure 4:
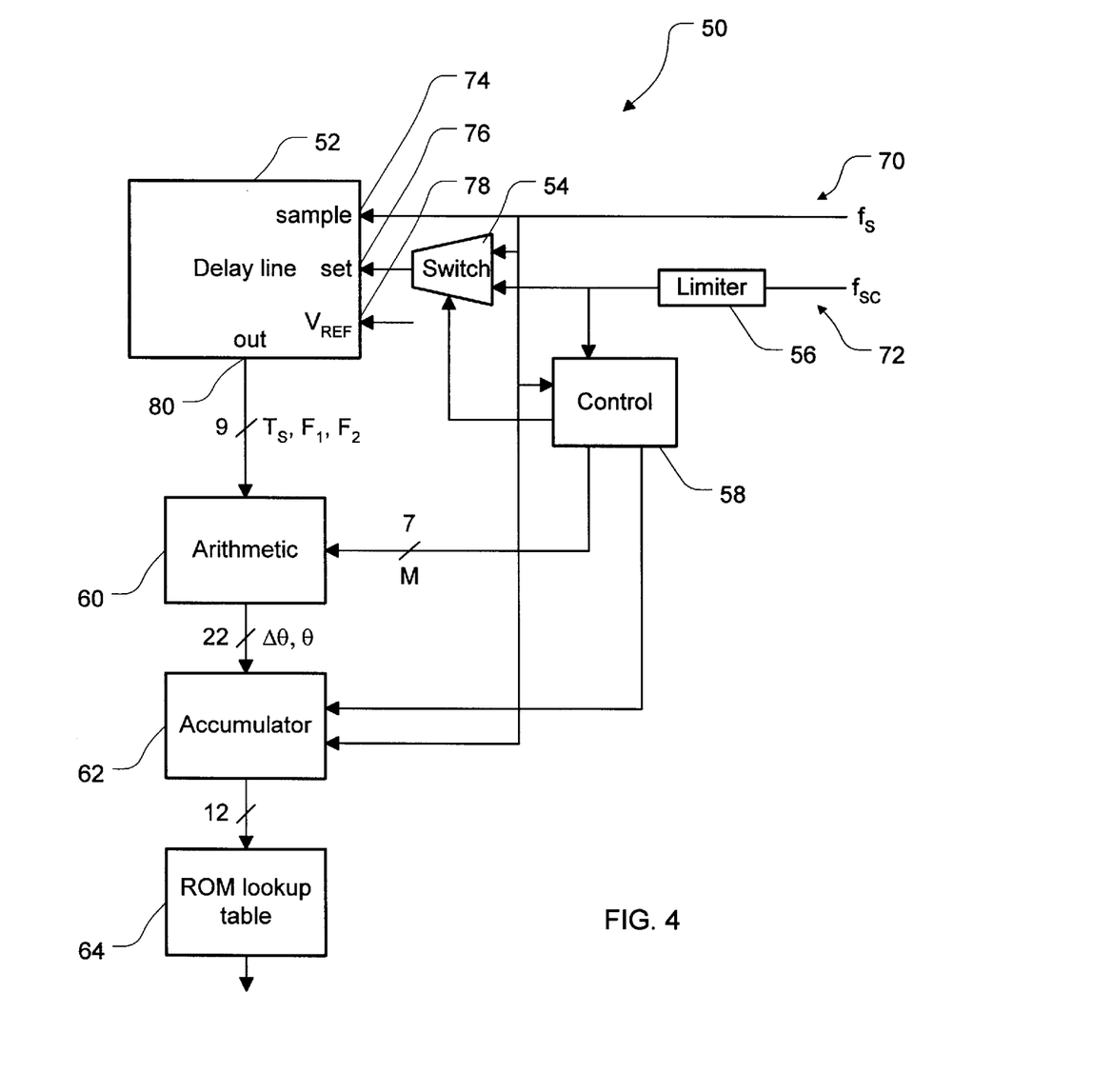
FIG. 4 is a block diagram depicting an embodiment of the present invention applied to synchronizing the phase of generated signals when demodulating a color television signal.

As previously described in the Background Art section, to demodulate a color television signal a pair of sinusoidal waveforms are needed which are in synchronization with the color burst portion of the signal. To do this digitally a sample clock must be used which has a fixed phase relationship with the color burst, so that the correct phase and hence the correct values for the sinusoidal functions can be calculated at each sample instant. FIG. 4 depicts a circuit 50 to do this.

The circuit 50 includes: a delay line 52, a switch 54, a limiter 56, a control unit 58, an arithmetic unit 60, an accumulator 62, and a lookup table 64. The delay line 52 has a sample port 74, a set port 76, a reference port 78, and an output port 80. The delay line 52, the switch 54, and the arithmetic unit 60 may be the same as their equivalents in circuit 10. However, the control unit 58 here is different because it includes both a sample clock counter 66 and a color burst counter 68 (neither shown, but both numbered for reference). Further, as discussed below, the inventors prefer to count integral cycles in this implementation, rather than rely on the detection of merely a leading edge to denote the occurrence of a cycle. Inputs to the circuit 50 are a sample clock signal 70 ($f_S$) (analogous to the first signal 28 ($f_A$) for circuit 10) and a color burst signal 72 ($f_{SC}$) (analogous to the second signal 30 ($f_B$) for circuit 10).

In many regards the circuit 50 may be used similarly to circuit 10. The switch 54 may be set so that the sample clock signal 70 ($f_S$) is fed into both the sample port 74 and the set port 76, and thus the period ($T_S$) of the sample clock signal 70 ($f_S$) is obtained at the output port 20 of the delay line 52. (This value may easily be converted to conventional units of seconds, but that is not necessary here since calculations can simply be carried out in time "units" of $t_D$.)

Figure 5:
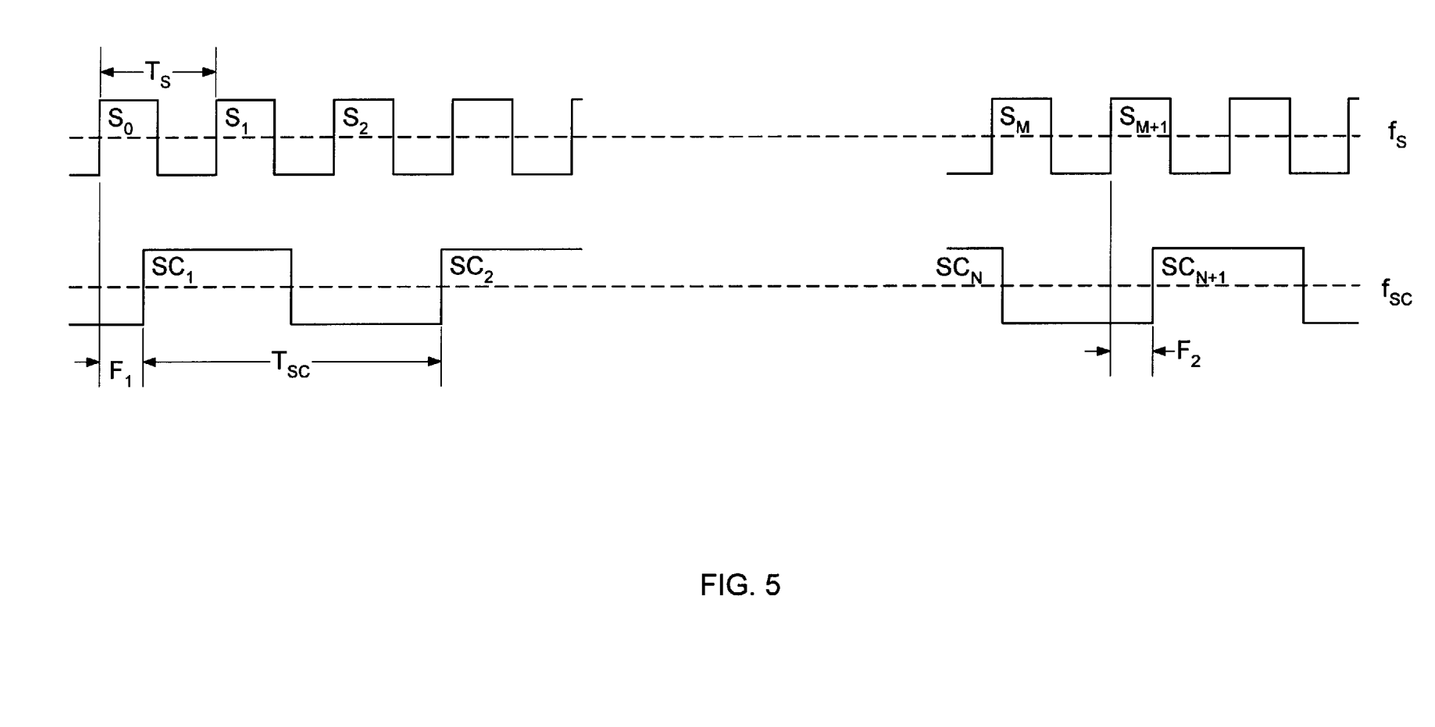
FIG. 5 is a timing diagram for input signals to FIG. 4.

FIG. 5 is a timing diagram of circuit 50 in use to get the phase of the color burst signal 72 ($f_{SC}$) with regard to the sample clock signal 70 ($f_S$). For this the sample clock signal 70 ($f_S$) continues to be fed into the sample port 74 of the delay line 52, and the color burst signal 72 ($f_{SC}$) is reshaped from a sine wave into square pulses by the limiter 56 and routed with the switch 54 into the set port 76 of the delay line 52. For each pulse in the reshaped color burst signal 72 ($f_{SC}$) the rising edges ($SC_1$ through $SC_9$ for NTSC, or through $SC_{10}$ for PAL) cause the bank of latch elements 34 in the delay line 52 to be set. The latch elements 34 are reset afterwards.

In the preferred embodiment not all of the pulses in the reshaped color burst signal 72 ($f_{SC}$) need to be used. Various motivations for this exist. For example, it has been one of the inventor's observations that the trailing pulse in the color burst signal 72 ($f_{SC}$) often is not as stable as the others (recall that NTSC and PAL use "around" 9 or 10 cycles respectively; it cannot always be relied upon that this many cycles will be present). Thus, including the last cycle may actually degrade the overall accuracy. Alternately, stopping measurement early with the delay line 52 provides additional time for the arithmetic unit 60 to perform calculations (recall that synchronization for color content demodulation must be accomplished at the beginning of each line, shortly after the color burst period). Therefore, whatever the motivation, the last pulse (or even pulses) may be ignored by counting to less than the total available pulses with the color burst counter 68. Of course, it is desirable to use as large a count (N) as feasible without sacrificing accuracy, because increased accuracy is then obtained by averaging additional instances.

In this preferred embodiment the inventors prefer to count integral pulses. This does require that the sample clock counter 66 and the color burst counter 68 in the control unit 58 be more sophisticated than counters triggering on only edge detection, but this can be a worthwhile tradeoff in some situations. For example, to reduce falsely triggered counts due to signal noise. Thus, here a value of N=7 or N=8 (for NTSC or PAL respectively) may be used.

Once the pulses in the reshaped color burst signal 72 ($f_{SC}$) begin to arrive (i.e., after rising edge ($SC_1$)), a count (M) of the number of cycles (again full cycles are used) in the sample clock signal 70 ($f_S$) is also taken with the sample clock counter 66.

After the rising edge ($S_1$) of the 1st pulse in the color burst signal 72 ($f_{SC}$) the output of the delay line 52, denoted by $F_1$, indicates the time delay from the preceding rising edge ($SC_0$) of the sample clock signal 70 ($f_S$) Similarly, right after the Nth rising edge ($SC_N$) the output of the delay line 52, denoted by $F_2$, indicates the time delay from the preceding rising edge ($S_M$) of the sample clock signal 70 ($f_S$). It follows that:

$$NT_{SC}=MT_S+(T_S-F_1)+F_2 \qquad \text{Eq. 6.1}$$

$$T_S/T_{SC}=N/(M+(1-F_1/T_S+F_2/T_S))=\theta \qquad \text{Eq. 6.2}$$

It should particularly be noted that the right side of Eq. 2 does not contain $T_{SC}$. Therefore, having counted N and M, and having measured $F_1$, $F_2$, and $T_S$, a value for the phase ($\theta$) can be obtained with high precision by using floating point arithmetic in the arithmetic unit 60. Since each time the sample clock signal 70 ($f_S$) advances by a full cycle the phase of the color burst signal 72 ($f_{SC}$) increases by an amount of $2\pi^*(T_S/T_{SC})$, $\theta$ is the phase increment of the color burst signal 72 ($f_{SC}$) modulo $2\pi$ with regard to the sample clock signal 70 ($f_S$). The maximum accuracy of $\theta$ can be determined by the ratio:

$$R=\pm(t_D/2)/NT_{SC} \qquad \text{Eq. 6.3}$$

As previously noted, with today's CMOS technology ($t_D/2$)=100 picoseconds is readily achievable. With a conventional color burst signal 72 ($f_{SC}$) frequency of 3.58 MHz for NTSC or 4.43 MHz for PAL, the value of R is of the order of 50–100 ppm, which is comparable to the accuracy of a crystal oscillator.

The arithmetic unit 60 calculates $\theta$ in the color burst period at the beginning of each scan line. Since the phase error accumulates along the line, it is important that precision of all data is preserved during subsequent calculations, which therefore calls for floating point arithmetic. The outputs of the arithmetic unit 60, $\theta$ and $\Delta\theta$ (defined as $F_2/T_S$) are fed to the accumulator 62.

Figure 6:
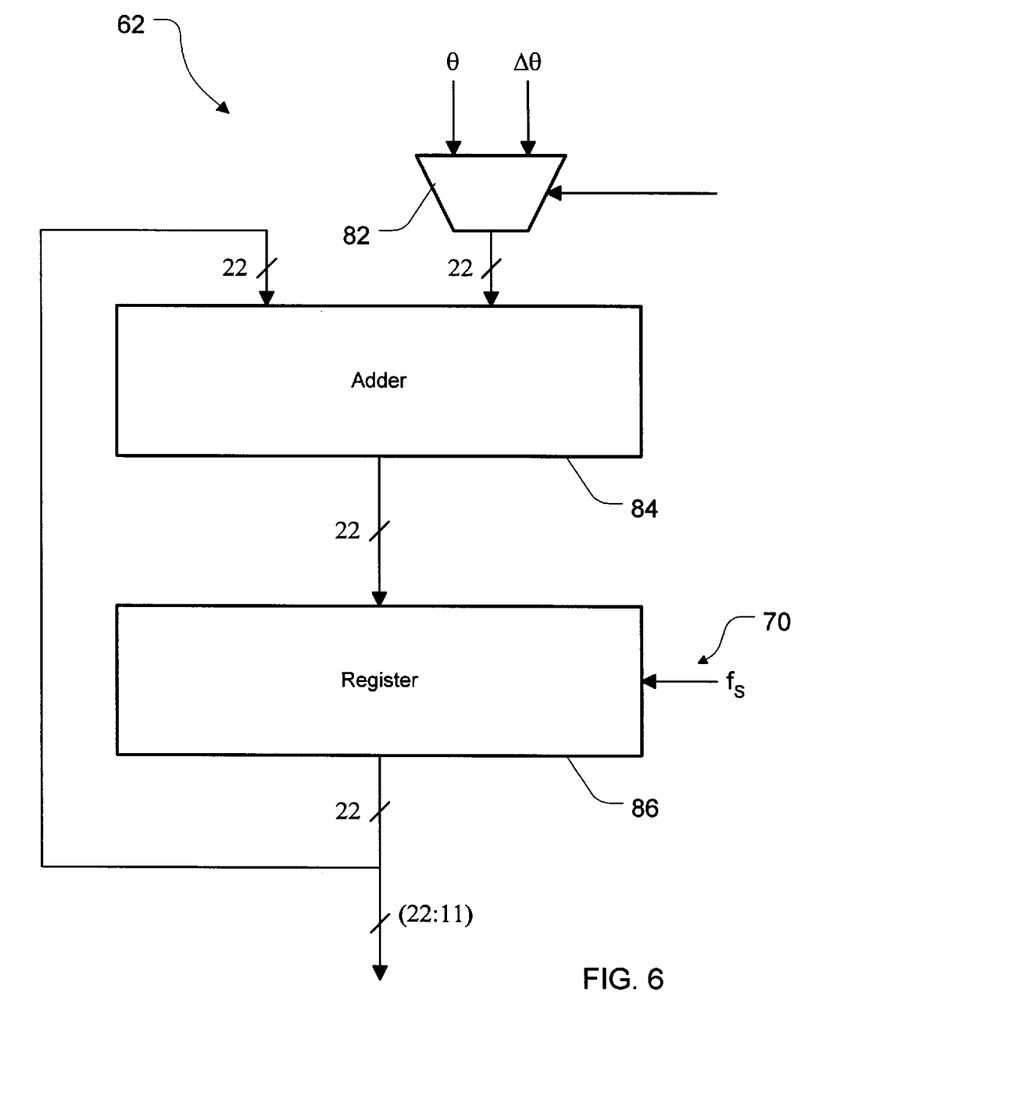
FIG. 6 depicts some internal details of the accumulator in FIG. 4.

FIG. 6 shows internal detail of the accumulator 62 used to generate the phase for the sinusoidal functions so that they are synchronized with the color burst signal 72 ($f_{SC}$). Included in the accumulator 62 are a switch 82, an adder 84, and a register 86. The constant phase shift $\Delta\theta$ is added with the adder 84 to the register 86 in the accumulator 62 as an initial condition. Then each time the sample clock counter 66 advances, a count of $\theta$ is also added to the register 86. Since the phase is modulo $2\pi$, overflow carries of the adder 84 are discarded and the current output of the accumulator 62 is used to access the lookup table 64 for the sinusoidal functions.

With the circuit 50, the values of the sinusoidal functions needed for demodulation can be obtained by accessing the lookup table 64, according to the phase stored in the accumulator 62 which is updated at the beginning of each cycle of the sample clock signal 70 ($f_S$). This data is then used to demodulate the chroma signal sampled at the same instant.

APPLICATION OF THE INVENTION IN INTERFEROMETRY

Figure 7:
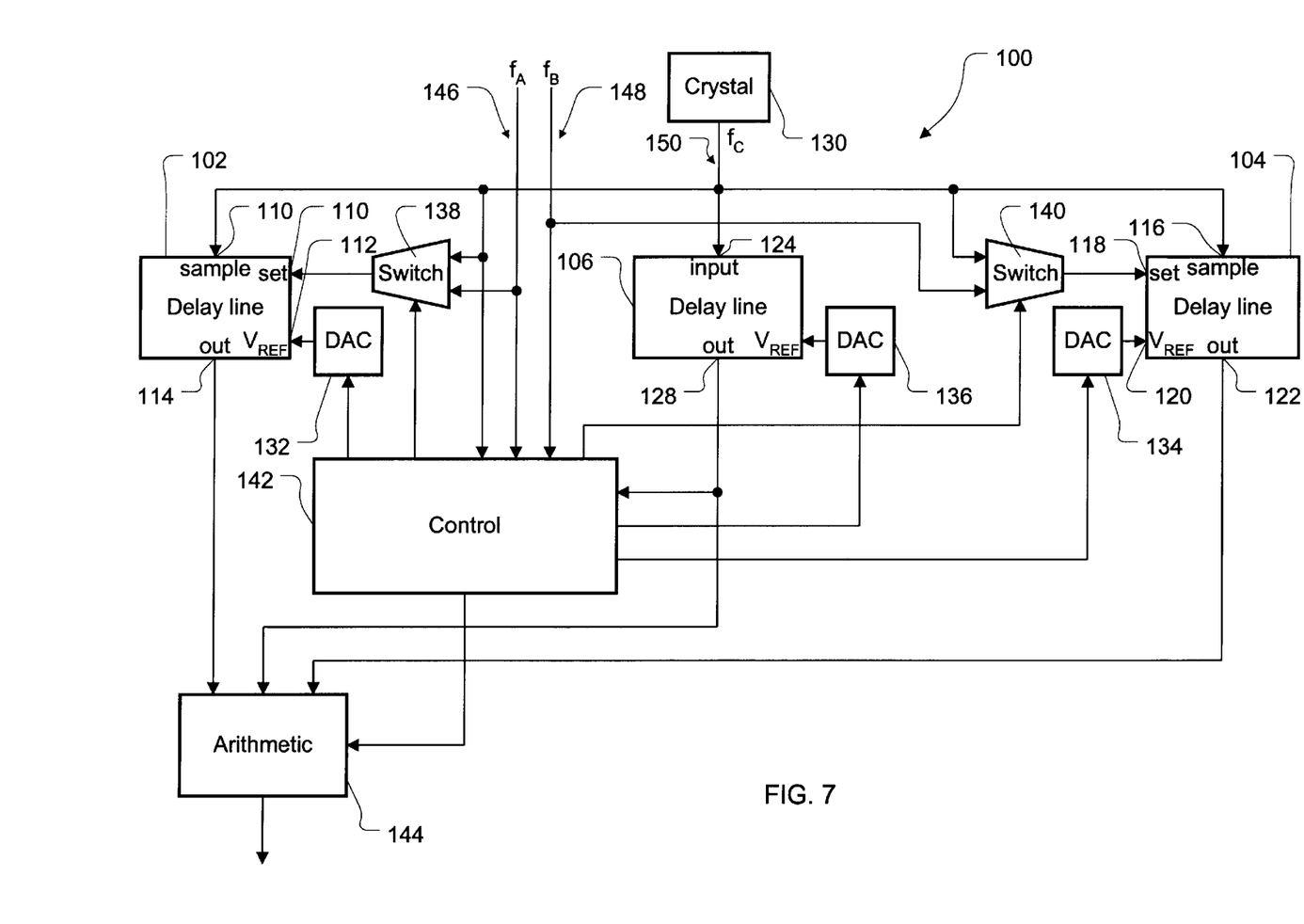
FIG. 7 is a block diagram depicting an embodiment of the present invention applied to calculating the phase between signals when processing displacement interferometer measurements.
Figure 8:
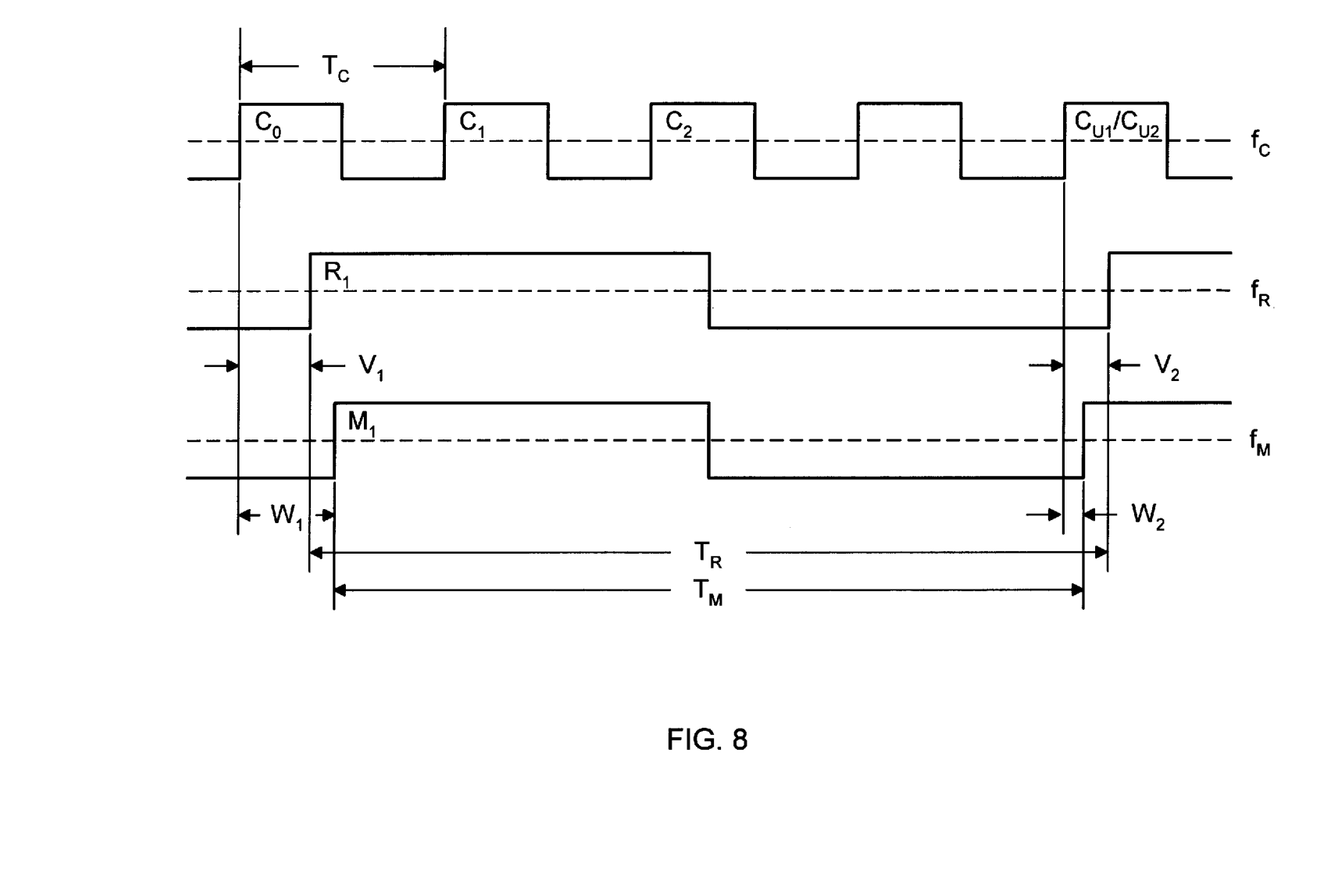
FIG. 8 is a timing diagram for input signals to FIG. 7.

As previously described in the Background Art section, displacement interferometry is a complex art. However, for present purposes the basic concern is that two electronic signals are produced, a reference and a measurement signal, and it is desired to very accurately determine the phase difference between them. FIG. 7 depicts a circuit 100 for doing this, and FIG. 8 is a timing diagram for the circuit 100 in use.

The circuit 100 includes three active delay lines: a reference delay line 102, a measurement delay line 104, and a clock delay line 106. These may all be instances of the delay line 12 of circuit 10. The reference delay line 102 has a sample port 108, a set port 110, a reference port 112 (for the voltage reference, not the reference signal ($f_S$)), and an output port 114. Similarly, the measurement delay line 104 has a sample port 116, a set port 118, a reference port 120 (again for the voltage reference), and an output port 122. The clock delay line 106 has an input port 124 (which is analogous to the sample port 14 and the set port 16 of a delay line 12 tied together), a reference port 126 (again for the voltage reference), and an output port 128.

Further included in the circuit 100 are a clock 130 (e.g., a 10 MHz crystal oscillator), a reference digital-to-analog converter (hereinafter reference DAC 132), a measurement digital-to-analog converter (hereinafter measurement DAC 134), a clock digital-to-analog converter (hereinafter clock DAC 136), a reference switch 138, a measurement switch 140, a control unit 142, and an arithmetic unit 144.

The main signals present in the circuit 100 are a reference signal 146 and a measurement signal 148 which are externally supplied (e.g., respectively, the reference and measurement signals from a dual frequency laser interferometer); and a clock signal 150 which is produced by the clock 130. The reference signal 146 is used as one signal input to the reference switch 138, and is monitored by the control unit 142. The measurement signal 148 is used as one signal input to the measurement switch 140, and is also monitored by the control unit 142. The clock signal 150 is fed to the input port 124, is monitored by the control unit 142, and used as the second input to both the reference switch 138 and the measurement switch 140. Summarizing, the switches (138 and 140) each have two signal inputs and an output, with input selection controlled by the control unit 142. The reference switch 138 has as its signal inputs the reference signal 146 and the clock signal 150, and its output goes to the set port 110. Similarly, the measurement switch 140 has as its signal inputs the measurement signal 148 and the clock signal 150, and its output goes to the set port 118.

To perform initial calibration of the circuit 100, the clock signal 150 is fed to the input port 124. The clock DAC 136 is then used to adjust the DC voltage supplied to the reference port 126 until one cycle of the clock signal 150 ($f_C$) produces a value at the output port 128 approaching the number of delay elements 32 inside the clock delay line 106. For example, if the clock delay line 106 has 300 delay elements 32, potentially producing 300 increments of $T_D$, an output of 256 might be used. This leaves room for adjustment, say between 235 and 300, yet provides good resolution enhancement (the number 256 is also quite convenient for calculations in binary). Once this adjustment is satisfactory the value at the output port 128, which can be termed a setup value ($C_C$), is stored for later use, much in the manner described previously for circuit 10.

Next the clock signal 150 is also fed into all of the sample port 108, the set port 110 (via the reference switch 138), the sample port 116, and the set port 118 (via the measurement switch 140). A value ($R_C$) is then obtained at the output port 114 and a value ($M_C$) is obtained at the output port 122. These are compared with the setup value ($C_C$), and if needed the reference DAC 132 and the measurement DAC 134 are separately used to adjust the voltages respectively supplied to the reference port 112 and the reference port 120, until new values ($R_C$ and $M_C$) are the same as the setup value ($C_C$). At this point the circuit 100 has been setup to obtain a good degree of resolution enhancement, and any discrepancies between the respective delay lines (102, 104, 106) have been adjusted out.

After the above initial calibration operation, the circuit 100 is dynamically maintained in calibration during use by obtaining new values ($C_i$) from the output port 128, comparing these with the setup value ($C_C$), and adjusting all of digital-to-analog converters (132, 134, 136) in tandem to compensate as needed.

The preceding is the preferred method for obtaining and maintaining the circuit 100 in calibration. However, other methods may also be used. For example, only one digital-to-analog converter, connected to all the reference ports (112, 120, 126), may be used. A setup value ($C_C$) is again obtained to adjust for good resolution enhancement, but here $C_C$ is used to set all of the delay lines (102, 104, 106) in tandem. The values ($R_C$ and $M_C$) are then also obtained, but here any discrepancies between these and the setup value ($C_C$) is noted and compensating calculations are performed in the arithmetic unit 144, rather than adjustment of the circuit 100. Maintained calibration can be obtained here by again comparing new values ($C_i$) with the setup value ($C_C$) and adjusting all the reference ports (112, 120, 126) in tandem.

Another alternate calibration example may use no digital-to-analog converters at all. Instead a manual DC voltage adjustment may be provided for an operator to set $V_{REF}$ the reference ports (112, 120, 126) of the delay lines (102, 104, 106) in tandem to obtain a suitable setup value ($C_C$). Then separate corrections for discrepancies of the values ($R_C$ and $M_C$) relative to the setup value ($C_C$), as well as collective correction for new values ($C_i$) differing from the setup value ($C_C$), can all be obtained using compensating calculations in the arithmetic unit 144.

FIG. 8 is a timing diagram depicting how the circuit 100 may be used to determine the phase information for the reference signal 146 and the measurement signal 148. In many regards the circuit 100 may also be used similarly to circuit 10. The period ($T_C$) of the clock signal 150 ($f_C$) has already been obtained during calibration, $T_C = C_i \cong C_C$ (units of $t_D$ are again used, since they cancel out in the calculations). Next a period ($T_R$) for the reference signal 146 ($f_R$) is found by using the control unit 142 to take a count ($U_R$) of cycles of the clock signal 150 ($f_C$) during a cycle of the reference signal 146 ($f_R$). Values ($V_1$ and $V_2$) are obtained from the output port 114 of the reference delay line 102, for use in applying:

$$T_R = U_R * T_C - V_1 + V_2 \qquad \text{Eq. 7.1}$$

Concurrently, a period ($T_M$) for the measurement signal 148 ($f_M$) is also found by using the control unit 142 to take another count ($U_M$) of the cycles of the clock signal 150 ($f_C$) during a cycle of the measurement signal 148 ($f_M$). Values ($W_1$ and $W_2$) are from the output port 122 of the measurement delay line 104, for use in applying:

$$T_M = U_M * T_C - W_1 + W_2 \qquad \text{Eq. 7.2}$$

The instantaneous phase ($p_i$) of the reference signal 146 ($f_R$) is calculated with:

$$p_i = V_1 / T_R \qquad \text{Eq. 7.3}$$

Similarly, the instantaneous phase ($q_i$) of the measurement signal 148 ($f_M$) is calculated with:

$$q_i = W_1 / T_M \qquad \text{Eq. 7.4}$$

And now using:

$$\text{Distance} = \lambda / (F * C_C) * (\Sigma(q_i - p_i)) \qquad \text{Eq. 7.5}$$

resolutions of better than $\lambda/2048$ become possible. For example, if four-pass optics are used (i.e., the optical enhancement factor F=8) and if 256 delay elements 32 are used (i.e., $C_C$=256), it follows that displacement can be resolved increments of $\lambda/2048$. If $\lambda$=633 nm, typical for HeNe lasers, this means that resolutions of less than 300 picometers are now easily obtainable.

In applications of the circuits (10, 50, and 100) where continuous signal processing is desired, such as displacement interferometry and potentially many others as well, it can be advantageous to obtain the periods of some signals early. In circuit 10 and circuit 50 the is of course done with the first signal 28 ($f_A$) and the sample clock signal 70 ($f_S$), because of the need to route these signals through the switches (22 and 54). However, in circuit 100 this is not necessarily done with the clock signal 150 ($f_C$), and if the change is expected to be less that the minimum resolution desired, it need not done for the period ($T_R$) of the reference signal 146 ($f_R$) either (i.e., because this can be expected to change very little). In particular for circuit 100, it can be advantageous to use a cycle "$R_0$" (not shown, but immediately preceding the cycle starting with rising edge $R_1$ in FIG. 8) for calculation of the period ($T_R$) of the reference signal 146 ($f_R$). In this manner, Eq. 7.3 can be solved earlier (since $V_2$ is obtained from a reference signal 146 ($f_R$) cycle ending before the measurement signal 148 ($f_M$) cycle used to obtain W2 even begins).

Still further, averages of some signal periods may be used, say to decrease the effect of electronic noise.

In addition to the above mentioned examples, various other modifications and alterations of the inventive circuits (10, 50, and 100) may be made without departing from the invention. Accordingly, the above disclosure is not to be considered as limiting and the appended claims are to be interpreted as encompassing the entire spirit and scope of the invention.

INDUSTRIAL APPLICABILITY

The circuits (10, 50, and 100) all show the present invention as well suited for a variety of applications. From circuit 10 it may be seen that the invention may be employed in virtually all electronic signal processing where accurate measurement of the period of one signal or where fine resolution of the phase relationship between two signals are desired. Notably, the frequency relationship between signals which circuit 10 is used to compare is virtually irrelevant. Thus, the invention overcomes one major failing of the prior art.

The circuit 50 is an example of the invention illustrating demodulation of the complex color television waveform. In general, this embodiment is capable of very fine resolution of the phase (i.e., timing) relationship between two portions of the same signal. More specifically, this embodiment may substitute for prior art demodulation circuitry. In this role, circuit 50 is notable because it does not use phase lock loop (PLL) subcircuitry. PLL's are currently widely used in television signal demodulation despite their inability to lock if there is an appreciable frequency discrepancy. This weakness of PLL's means that the quality of demodulation may be poor, if even possible in extreme situations, and that expensive additional circuitry such as digital filters (which themselves can degrade image quality) may be needed. By not using a PLL, the circuit 50 suffers from none of their weaknesses.

The circuit 100 is an example of the invention illustrating applicability in laser interferometry displacement measurement. In general, this particular embodiment illustrates both initial setup and maintained-during-use calibration techniques, to insure that the invention reliably provides the desired very fine resolution of the phase which it is capable of. More specifically, this is a complex embodiment illustrating how the present invention can be used at and to extend the forefront of human measuring capability. Using the circuit 100, sub-nanometer resolution of displacements are now easily accomplished.

The circuits (10, 50, and 100) all may be implemented relatively inexpensively, and using generally conventional electronic components and techniques. The inventors have developed CMOS logic family implementations of the invention. This is particularly notable for circuit 100, since present high resolution interferometry often must necessarily employ the ECL logic family, which has notorious disadvantages (e.g., expense, power consumption, and radio interference generation and susceptibility). Further, the component parts of the invention are not particularly complex. Even seemingly complex components such as the control units (24, 58, and 142) and the arithmetic units (26, 60, and 144) are easily produced with conventional current techniques.

For the above, and other, reasons, it is therefore expected that the circuits (10, 50, and 100) of the present invention will have widespread industrial applicability, and it is also expected that the commercial utility of the present invention will be extensive and long lasting.

We claim:

1. A device for determination of waveform period, comprising:
    a delay line having a sample port, a set port, a reference port, and an output port;
    said delay line including a plurality of delay elements, latch elements, and an encoder, wherein said sample port connects to input of a first of said plurality of delay elements and all said delay elements have output connected to input of a respective latch element and said set port connects in common to all said latch elements and said reference port connects in common to all said latch elements and all said latch elements have output connected to said encoder and output of said encoder connects to said output port;
    a control unit;
    an arithmetic unit;
    means for connecting a first waveform to said sample port and to said control unit;
    means for connecting a second waveform to said set port and to said control unit;
    means for connecting said reference port to an externally supplied DC voltage source;
    means for connecting said output port to said arithmetic unit;
    means for connecting said control unit to said arithmetic unit;
    said control unit having capability:
        to take a first cycle count of cycles of said first waveform occurring during a target cycle of said second waveform and to pass a first cycles count to said arithmetic unit, and
        to direct said arithmetic unit such that an initial value is obtained from said output port at the start of said target cycle and a terminal value is obtained from said output port at the end of said target cycle; and
    said arithmetic unit having capability to calculate the period of said second waveform from a period of said first waveform, said first cycles count, and said initial and terminal values.

2. The device of claim 1, further comprising:
    switching means to switch connection of said set port between said first and second waveforms;
    said control unit further having capability to direct said switching means to switch said first waveform into said set port such that a measured period of said first waveform is provided at said output port; and
    said arithmetic unit further having capability to calculate the period of said second waveform using said measured period.

3. The device of claim 1, wherein said delay elements produce substantially equal units of delay.

4. The device of claim 1, wherein said control unit counts leading edges of cycles to obtain said first cycle count.

5. The device of claim 1, wherein said control unit counts complete cycles to obtain said first cycle count.

6. The device of claim 1, further comprising:
    said control unit further having capability:
        to take a first cycle count of cycles of said first waveform occurring during a target group of cycles of said second waveform and to take a second cycle count of cycles in said target group and to pass both said cycle counts to said arithmetic unit, and
        to direct said arithmetic unit such that said initial value is obtained from said output port at the start of said target group and said terminal value is obtained from said output port at the end of said target group; and
    said arithmetic unit further having capability to calculate an average period of said second waveform from a period of said first waveform, both said cycle counts, and said initial and terminal values.

7. A device for determination of phase relationship, comprising:
    a delay line having a sample port, a set port, a reference port, and an output port;
    said delay line including a plurality of delay elements, latch elements, and an encoder, wherein said sample port connects to input of a first of said plurality of delay elements and all said delay elements have output connected to input of a respective latch element and said set port connects in common to all said latch elements and said reference port connects in common to all said latch elements and all said latch elements have output connected to said encoder and output of said encoder connects to said output port;

a control unit;

an arithmetic unit;

means for connecting a first waveform to said sample port and to said control unit;

means for connecting a second waveform to said set port and to said control unit;

means for connecting said reference port to an externally supplied DC voltage source;

means for connecting said output port to said arithmetic unit;

means for connecting said control unit to said arithmetic unit;

said control unit having capability:
- to take a first cycle count of cycles of said first waveform occurring during a target cycle of said second waveform and to pass a first cycles count to said arithmetic unit, and
- to direct said arithmetic unit such that an initial value is obtained from said output port at the start of said target cycle and a terminal value is obtained from said output port at the end of said target cycle; and said arithmetic unit having capability to calculate the phase of said second waveform relative to said first waveform from a period of said first waveform, said first cycle count, and initial and terminal values.

8. The device of claim 7, further comprising:

switching means to switch connection of said set port between said first and second waveforms;

said control unit further having capability to direct said switching means to switch said first waveform into said set port such that a measured period of said first waveform is provided at said output port; and said arithmetic unit further having capability to calculate the period of said second waveform using said measured period.

9. The device of claim 7, wherein said delay elements produce substantially equal units of delay.

10. The device of claim 7, wherein said control unit counts leading edges of cycles to obtain said first cycle count.

11. The device of claim 7, wherein said control unit counts complete cycles to obtain said first cycle count.

12. The device of claim 7, further comprising:

said control unit further having capability:
- to take a first cycle count of cycles of said first waveform occurring during a target group of cycles of said second waveform and to take a second cycle count of cycles in said target group and to pass both said cycle counts to said arithmetic unit, and
- to direct said arithmetic unit such that said initial value is obtained from said output port at the start of said target group and said terminal value is obtained from said output port at the end of said target group; and said arithmetic unit further having capability to calculate an average period of said second waveform from a period of said first waveform, both said cycle counts, and said initial and terminal values.

13. A device for digitally generating a synchronized waveform in close phase relationship with a subject waveform, comprising:

a delay line having a sample port, a set port, a reference port, and an output port;

said delay line including a plurality of delay elements, latch elements, and an encoder, wherein said sample port connects to input of a first of said plurality of delay elements and all said delay elements have output connected to input of a respective latch element and said set port connects in common to all said latch elements and said reference port connects in common to all said latch elements and all said latch elements have output connected to said encoder and output of said encoder connects to said output port;

a control unit;

an arithmetic unit;

means for accumulation;

means for waveform generation;

switching means to switch connection of said set port between an externally supplied sample clock waveform and the subject waveform;

means for connecting said sample clock waveform to said sample port, to said control unit, and to said means for accumulation;

means for connecting the subject waveform to said control unit;

means for connecting said reference port to an externally supplied DC voltage source;

means for connecting said output port to said arithmetic unit;

means for connecting said arithmetic unit to said means for accumulation;

means for connecting said means for accumulation to said means for waveform generation;

means for connecting said control unit to said switching means, said arithmetic unit, and said means for accumulation;

said control unit having capability:
- to direct said switching means,
- to take a first cycle count of cycles of said sample clock waveform occurring during a target group of cycles of the subject waveform and to take a second cycle count of cycles in said target group and to pass both said cycle counts to said arithmetic unit, and
- to direct said arithmetic unit such that a clock period value is obtained from said output port for said sample clock waveform and an initial value is obtained from said output port at the start of said target group and a terminal value is obtained from said output port at the end of said target group;

said arithmetic unit having capability to calculate a phase increment value and a phase shift value of the subject waveform relative to said sample clock waveform from said clock period value, both said cycle counts, and said initial and terminal values;

said means for accumulating having capability to accept said phase shift value and accumulate said phase increment value for each cycle of said sample clock waveform as a present phase value; and said means for waveform generation having capability to generate the synchronized waveform based upon said present phase value.

14. The device of claim 13, wherein said control unit counts complete cycles to obtain said first cycle count, thereby reducing false counts due to noise in said subject waveform.

15. A device for determination of phase relationship between a first waveform and a second waveform, comprising:

a first delay line, a second delay line, and a clock delay line each having a sample port, a set port, a reference port, and an output port;

all said delay lines including a plurality of delay elements, latch elements, and an encoder, wherein:

within each of said delay lines said sample port connects to input of a first of said plurality of delay elements and all said delay elements have output connected to input of a respective latch element and said set port connects in common to all said latch elements and said reference port connects in common to all said latch elements and all said latch elements have output connected to said encoder and output of said encoder connects to said output port;

said clock delay line having said sample port and said set port connected;

means for generating a clock waveform;

a control unit;

means for connecting said clock waveform to said sample ports of all said delay lines and to said control unit;

first switching means to switch connection of said set port of said first delay line between the first waveform and said clock waveform;

second switching means to switch connection of said set port of said second delay line between the second waveform and said clock waveform;

means for connecting said reference ports of all said delay lines to an externally supplied DC voltage source;

an arithmetic unit;

means for connecting said output ports of all said delay lines and said control unit to said arithmetic unit;

said control unit having capability:

to direct said all said switching means to switch said clock waveform into all said set ports, to take a first cycle count of cycles of said clock waveform occurring during a target cycle of the first waveform and to take a second cycle count of cycles of said clock waveform occurring during a target cycle of the second waveform and to pass both said cycle counts to said arithmetic unit, and to direct said arithmetic unit such that initial values are obtained from said output ports of said first and second delay lines at the start of respective said target cycles of the first and second waveforms and terminal values are obtained from said output ports of said first and second delay lines at the end of respective said target cycles of the first and second waveforms; and said arithmetic unit having the capability to calculate the phase of the first and second waveforms relative to said clock waveform from periods of the first waveform and the second waveform and said clock waveform, all said cycles counts, and all said initial and terminal values.

16. The device of claim 15, further comprising said means for connecting said reference ports including means for adjusting voltage collectively into all said reference ports from said externally supplied DC voltage source.

17. The device of claim 16, wherein said means for adjusting voltage includes a potentiometer.

18. The device of claim 16, further comprising:

said means for adjusting voltage including a DAC connected collectively to all said reference ports;

means for connecting said DAC to said control unit; and said control unit further having capability to direct said DAC to vary proportion of voltage from said externally supplied DC voltage source.

19. The device of claim 15, further comprising said means for connecting said reference ports including means for adjusting voltage individually into all said reference ports from said externally supplied DC voltage source.

20. The device of claim 19, wherein said means for adjusting voltage includes:

a first potentiometer connected to said reference port of said first delay line;

a second potentiometer connected to said reference port of said second delay line; and a clock potentiometer connected to said reference port of said clock delay line.

21. The device of claim 19, further comprising:

said means for connecting said reference ports including a first DAC, a second DAC, and a clock DAC respectively connected to said reference ports of said delay lines;

means for connecting all said DAC's to said control unit;

said control unit further having capability to individually and collectively direct all said DAC's to vary proportion of voltage from said externally supplied DC voltage source.

* * * * *